United States Patent

Iwamatsu

Patent Number: 5,179,426
Date of Patent: Jan. 12, 1993

[54] JOSEPHSON DEVICE

[75] Inventor: Seiichi Iwamatsu, Suwa, Japan

[73] Assignee: Seiko Epson Corporation, Tokyo, Japan

[21] Appl. No.: 226,606

[22] Filed: Aug. 1, 1988

[30] Foreign Application Priority Data

Aug. 4, 1987 [JP] Japan .................................. 62-194650
Nov. 4, 1987 [JP] Japan .................................. 62-278553
May 11, 1988 [JP] Japan .................................. 62-115234

[51] Int. Cl.$^5$ .......................................... H01L 39/22
[52] U.S. Cl. ........................................ 505/1; 505/702; 257/34; 257/35; 257/39; 257/33
[58] Field of Search ................. 357/5, 4, 23.14, 6; 505/855, 874, 702, 1

[56] References Cited

U.S. PATENT DOCUMENTS

| | | | |
|---|---|---|---|
| 4,096,508 | 6/1978 | Fulton | 357/5 |
| 4,157,555 | 6/1979 | Gray | 357/5 |
| 4,589,001 | 5/1986 | Sakai et al. | 357/5 |

FOREIGN PATENT DOCUMENTS

| | | | |
|---|---|---|---|
| 55-183073 | 7/1982 | Japan | 357/5 |
| 60-43885 | 3/1985 | Japan | 357/5 |
| 61-6882 | 1/1986 | Japan | 357/5 |
| 62-57260 | 3/1987 | Japan | 357/5 |

OTHER PUBLICATIONS

"Epitaxial Ordering of Oxide Superconductor Thin Films on (100) $SrTiO_3$ Prepared By Pulsed Laser Evaporation", Wu et al., Appl. Phys. Lett., vol. 51, #11, 14 Sep. 1987, pp. 861–863.

Primary Examiner—Rolf Hille
Assistant Examiner—Steven Loke
Attorney, Agent, or Firm—Spensley Horn Jubas & Lubitz

[57] ABSTRACT

A transistor structure which utilizes the Josephson effect and/or tunneling effect. The Josephson transistors of the invention are composed of superconductive films and tunneling films and work at a high speed with a low energy consumption. They are suitable for the construction of integrated circuits, especially digital circuits.

8 Claims, 2 Drawing Sheets

JOSEPHSON DEVICE

BACKGROUND OF THE INVENTION

1. Field of the Invention

The present invention relates to a transistor structure which utilizes the Josephson effect and/or the tunneling effect.

2. Description of the Prior Art

Conventional electronic solid state devices which utilize the Josephson effect and/or the tunneling effect include only diode devices, such as Josephson diodes and tunnel diodes. A disadvantage of conventional Josephson diodes and tunnel diodes is that when used individually, they are not adequate to construct analog circuits and digital circuits, especially digital integrated circuits having AND gates, OR gates, NAND gates, NOR gates, and flip-flop circuits.

SUMMARY OF THE INVENTION

It is an object of the present invention to overcome the above-mentioned disadvantage involved in the conventional technology.

Accordingly, a more specific object of the present invention is to provide a transistor structure which utilizes the Josephson effect and/or the tunneling effect.

The above and other objects are achieved, according to the present invention by various forms of Josephson transistor having two main electrodes, at least one of which is of superconductive material, separated from one another by a controllable region constituted by a tunneling film of insulation material or a microbridge of superconducting material. Certain embodiments of the invention are of the field effect type and include an insulating layer and a gate electrode for controlling the controllable region.

DESCRIPTION OF THE PREFERRED EMBODIMENTS

Figure 1:
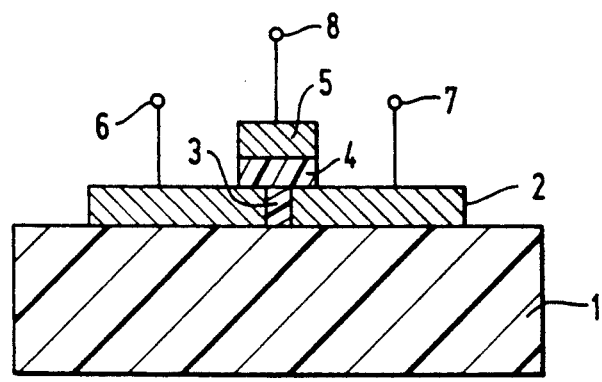
FIGS. 1 to 4 are sectional views of Josephson transistors according to preferred embodiments of the present invention.

The invention will be described with reference to exemplary embodiments illustrated in the drawing.

Each superconductor layer or film employed in these embodiments can be a high temperature superconductor, such as $Bi_1Sr_1Ca_1CU_2O_8$, $Tl_1Ba_1Ca_1Cu_3O_7$ or $Y_1ba_2Cu_3O_7$, or a low temperature superconductor, such as NbGe, NbSn, NbTi, or NbN. The selected superconductor should be of normal purity, i.e., neither of ultra-high purity nor provided with specific impurity dopants.

The various layers can, in general, be as thin as permitted by existing manufacturing techniques.

A Josephson field-effect transistor is one example of the invention as shown in section in FIG. 1. It is made up of an insulation substrate 1 of strontium titanate ($SrTiO_3$) and a superconductor film 2 (about $1\mu$ thick) of $Y_1Ba_2Cu_3O_7$ or NbN, etc., which is formed on the insulation substrate 1. The superconductor film 2 has a groove formed throughout its thickness and width, by etching, so that film 2 is divided into two parts, and a tunneling insulation film 3 (about 20 Å thick in the horizontal direction between the two parts of film 2) of $SiO_2$ or NbO is formed in the groove.

An insulation layer 4 (about 50 Å to 1000 Å thick) of $SiO_2$ formed on tunneling insulation layer 3 and part of layer 2. A gate electrode 5 (about $0.1\mu$ to $1\mu$ thick) of conducting material or superconducting material similar to that of film 2 is formed on insulation film 4.

One of the two parts of the superconductor film 2 divided by the etched groove functions as the source 6 and the other part functions as the drain 7, and the gate electrode 5 functions as the gate 8. The components arranged as mentioned above constitute a Josephson field-effect transistor in which the current flowing from source 6 to drain 7 through tunneling insulation film 3 is controlled by an electric field produced by gate electrode 5.

Figure 2:
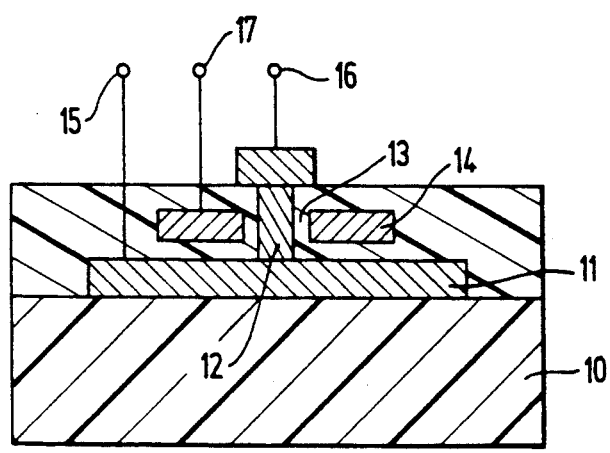

FIG. 2 illustrates an embodiment of a microbridge type Josephson field-effect transistor according to the invention. This device includes an insulation substrate 10, a source electrode 11 of superconductor material, which can be one of the compositions identified earlier herein, an insulation film 13 surrounding source electrode 11, and a vertical microbridge 12 in the form of a film of superconductor material, such as NbN, $Y_1Ba_2Cu_3O_7$, etc., a gate electrode 14, in the form of a ring is formed in insulation film 13 so as to surround microbridge 12. Gate electrode 14 is separated from microbridge 12 by portions of insulation film 13. The transistor is completed by a source terminal 15, a drain terminal 16 connected to a drain electrode in the form of a superconductor film, and a gate terminal 17. Current flowing between source terminal 15 and drain terminal 16 through microbridge 12 is controlled by the electric field produced by the voltage applied via terminal 17 to gate electrode 14.

The embodiment illustrated in FIG. 2 can be fabricated as follows:

Insulating substrate 10 can be provided in the form of a layer of a material such as MgO, $SrTiO_3$, $SiO_2$, $Al_2O_3$, or the like, with a thickness of about 0.3 to 1 u.

Source electrode 11 is formed by first vapor depositing a superconductor film to a thickness of about 0.1 to $1\mu$ on substrate 10 and then giving electrode 11 its desired outline by removing excess material by photoetching.

Then an insulating film of $SiO_2$ is formed on at least electrode 11 to a thickness of about 0.1 to $1\mu$ by chemical vapor deposition and gate electrode 14 is formed on the insulating film to a thickness of about 0.1 to $1\mu$ by vapor deposition, followed by photoetching to give electrode 14 the desired outline.

Then insulating film 13 of $SiO_2$ is formed by chemical vapor deposition so that insulating material with a thickness of about 50 to 1000 Å is formed on the side face of electrode 14 and a thickness of about 0.1 to $1\mu$ is formed on the surface of electrode 14.

Photoetching is performed on film 13 to produce an opening with a diameter of $0.1\mu$ or less and microbridge 12 is formed in the opening by vapor deposition.

The drain electrode is then formed to a thickness of about 0.1 to $1\mu$ by vapor deposition and photoetching.

Figure 3:
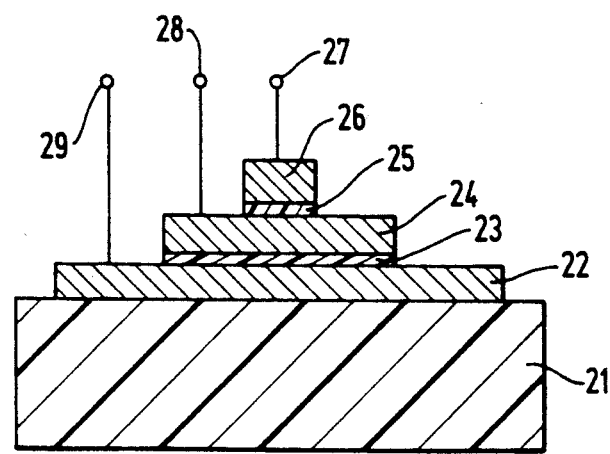

A Josephson junction transistor is another example of the invention as shown in section in FIG. 3. It is made up of the following components: an insulation substrate 21; a first superconductor film 22 of $Y_1Ba_2Cu_3O_7$ or NbN, etc., which is formed on the insulation substrate 21; a first tunneling insulation film 23 (about 20 Å thick)

of SiO$_2$ or NbO formed on first superconductor film 22; a second superconductor film 24 formed on first tunnel insulation film 23; a second tunneling insulation film 25 formed on second superconductor film 24; and a third superconductor film 26 formed on second tunnel insulation layer 25. Films 24 and 26 can have the same composition as film 22, and film 25 can have the same composition as film 23.

The components arranged as mentioned above constitute a transistor in which tunnel insulation films 23 and 25 function as Josephson junctions, third superconductor film 26 functions as the emitter 27, second superconductor film 24 functions as the base 28, and first superconductor film 22 functions as the collector 29.

Figure 4:
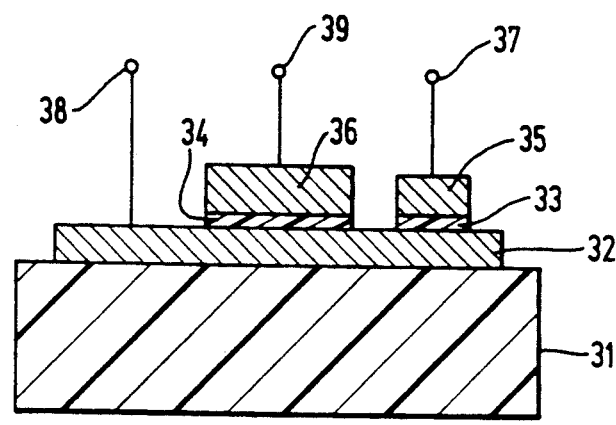

A lateral Josephson junction transistor is another example of the invention as shown in FIG. 4. It is made up of the following components: an insulation substrate 31; a first superconductor film 32 formed on insulation substrate 31; a first tunneling insulation film 33 and a second tunneling insulation film 34 which are formed on first superconductor film 32; a second superconductor film 35 formed on first tunneling insulation film 33; and a third superconductor film 36 formed on second tunneling insulation film 34. The components arranged as described above constitute a Josephson junction lateral transistor in which second superconductor film 35 functions as the emitter 37, third superconductor film 36 functions as the collector 39, and first superconductor film 32 functions as the base 38. The films of this embodiment can have the same compositions as the corresponding films of FIG. 3.

Figure 5A:
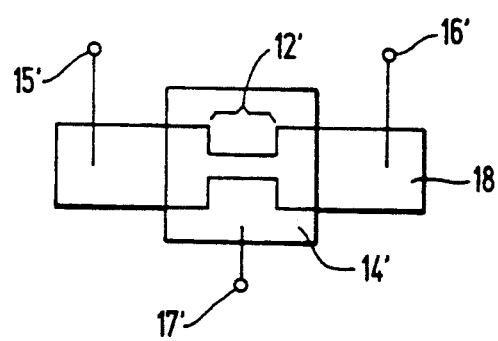
FIGS. 5a and 5b are, respectively, a plan view and a cross-sectional view of a variation of the embodiment of FIG. 2.
Figure 5B:
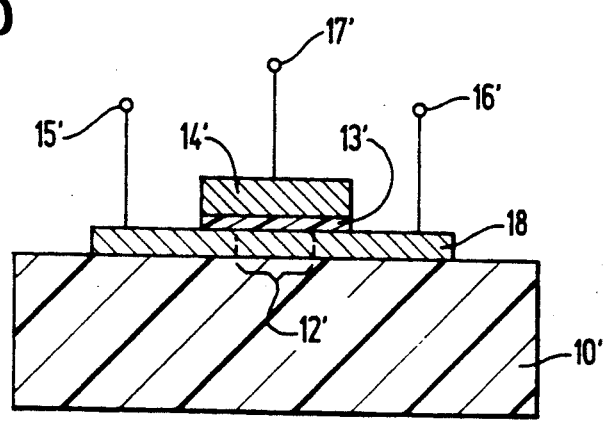

FIG. 5a and 5b illustrate another embodiment of the invention which is a horizontal microbridge-type Josephson field-effect transistor constituting a variant of the embodiment of FIG. 2. In FIGS. 5a and 5b, a superconductor film 18 having a thickness of the order of 0.1 to 1$\mu$ is formed on substrate 10' and a microbridge 12' is created by photoetching. Microbridge 10' could have a width of the order of magnitude of the thickness of film 18. Then, insulation film 13' is formed to a thickness of about 50 to 1000 Å on microbridge 12' and gate electrode 14' is deposited on film 13'. As shown in the plan view of FIG. 5a, insulation film 13' and gate electrode 14' laterally overlap superconductor film 18.

As mentioned above, the present invention provides field-effect transistors and junction transistors which utilize the Josephson effect. These Josephson transistors work at a high speed with a low energy consumption. Moreover, they permit the easy construction of integrated circuits, especially digital circuits.

While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A Josephson field-effect transistor having a source, a drain and a gate, and comprising: a substrate of electrical insulating material; a film of superconductive material formed on said substrate, said film being provided with a groove extending to said substrate and across said film in order to divide said film into two parts which are separated from one another and which constitute the source and drain, respectively, of said transistor; a tunneling film of electrical insulating material disposed in said groove for conducting electric current between the source and drain under control of an electric field; a gate electrode disposed for imposing an electric field on said tunneling film and constituting the gate of said transistor; a second film of electrical insulating material interposed between said tunneling film and said gate electrode; and conductor means connected to said gate electrode and the two parts of said film of superconductive material.

2. A transistor as defined in claim 1 wherein said groove is formed in said film of superconductive material by etching.

3. A transistor as defined in claim 1 wherein said film of superconductive material consists essentially of at least one of Bi$_1$Sr$_1$Ca$_1$Cu$_2$O$_8$, Tl$_1$Ba$_1$Ca$_1$Cu$_3$O$_7$, Y$_1$Ba$_2$Cu$_3$O$_7$, NbGe, NbSn, NbTi and NbN.

4. A transistor as defined in claim 1 wherein said substrate consists essentially of SrTiO$_3$.

5. A transistor as defined in claim 1 wherein said gate electrode is made of at least one of a conductive material and a superconductive material.

6. A transistor as defined in claim 1 wherein said tunneling film consists essentially of at least one of SiO$_2$ and NbO.

7. A transistor as defined in claim 6 wherein said tunneling film has a thickness of about 20 Å.

8. A transistor as defined in claim 1 wherein said tunneling film has a thickness of about 20 Å.

* * * * *